United States Patent [19]

Otani et al.

[11] Patent Number: 5,238,527
[45] Date of Patent: Aug. 24, 1993

[54] LANTHANUM BORIDE TYPE SINGLE CRYSTAL AND METHOD FOR GROWING THE SAME

[75] Inventors: Shigeki Otani; Takaho Tanaka; Yoshio Ishizawa, all of Tsukuba, Japan

[73] Assignee: National Institute for Research in Inorganic Materials, Tsukuba, Japan

[21] Appl. No.: 706,197

[22] Filed: May 28, 1991

[30] Foreign Application Priority Data

Jul. 19, 1990 [JP] Japan .................. 2-191671
Oct. 29, 1990 [JP] Japan .................. 2-291354

[51] Int. Cl.⁵ ................................. C30B 25/02
[52] U.S. Cl. ........................ 156/615; 156/604; 156/DIG. 63; 156/DIG. 89
[58] Field of Search ............ 156/604, 615, DIG. 63, 156/DIG. 89

[56] References Cited

U.S. PATENT DOCUMENTS 3,386,919  6/1968  Forrat .................. 156/DIG. 63
4,030,963  6/1977  Gibson et al. .......... 156/DIG. 63

Primary Examiner—Robert Kunemund
Assistant Examiner—Felisa Garrett
Attorney, Agent, or Firm—Oblon, Spivak, McClelland, Maier & Neustadt

[57] ABSTRACT

The present invention relates to a lanthanum boride type single crystal having the chemical formula $(La_{1-x}M_x)B_6$ ($0.01 \leq x \leq 0.50$) wherein M is at least one rare earth element selected from the group consisting of Ce, Pr, Nd, Sm and Gd, and further relates to a method for growing a lanthanum boride type single crystal by fusion method, which comprises using a lanthanum boride starting material containing from 1 to 50 mol % of at least one rare earth boride selected from the group consisting of $CeB_6$, $PrB_6$, $NdB_6$, $SmB_6$ and $GdB_6$.

6 Claims, 4 Drawing Sheets

LANTHANUM BORIDE TYPE SINGLE CRYSTAL AND METHOD FOR GROWING THE SAME

BACKGROUND OF THE INVENTION

1. Field of the Invention

The present invention relates to a lanthanum boride ($LaB_6$) type single crystal and a method for growing the same.

2. Description of the Prior Art

A lanthanum boride single crystal is presently used as a thermionic electron emitter having a high brightness and a long life for a scanning electron microscope, an electron beam delineator and the like. For the electron emitting material, it is necessary to use a highly pure single crystal with high quality.

There are known solution method, gas phase method, fusion method and the like as a method for growing a lanthanum boride single crystal, but among them, fusion method using a high growing temperature is most suitable for growing a single crystal with high purity.

Examples of the fusion method include arc Verneuil's method, floating zone (FZ) method, pedestal method and the like, but among them, the floating zone method is most suitable for growing a signal crystal with high quality.

Heretofore, in the method for growing a lanthanum boride signal crystal by fusion method, a lanthanum boride starting material with high purity has been used for raising the purity of a single crystal. However, single crystals grown by this method often have a disadvantage of containing many defects (for example, a grain boundary density is $10^3 cm/cm^2$). Accordingly, under the present circumstances, the crystal tips for the electron emitter must be cut out the high quality part so as not to contain the defects.

An object of the present invention is to provide a lanthanum boride single crystal with high quality having no defects by removing the disadvantages of the above mentioned conventional techniques.

In order to solve the above problems, we have studied the fact that many defects are present in a single crystal grown even by using a highly pure lanthanum boride starting material by the conventional fusion method, and have tried to incorporate other materials into lanthanum boride as a starting material. As this result, we have found that a grain boundary density in a single crystal is reduced when it is grown by using a starting material comprising lanthanum boride having a rare earth boride incorporated therein, the rare earth boride being selected from the group consisting of $CeB_6$, $PrB_6$, $NdB_6$, $SmB_6$, $GdB_6$ and a mixture thereof. Particularly, we have found and achieved the present invention that a single crystal with high quality having no grain boundary can be obtained by incorporating the above mentioned rare earth boride in an amount of 20 mol % or higher into a lanthanum boride starting material when growing a single crystal having a diameter of 1 cm.

SUMMARY OF THE INVENTION

The present invention relates to a lanthanum boride type single crystal having the chemical structure of $(La_{1-x}M_x)B_6$ ($0.01 \leq x \leq 0.50$) wherein M is at least one rare earth element selected from the group consisting of Ce, Pr, Nd, Sm and Gd.

The present invention further relates to a method for growing a lanthanum boride type single crystal by fusion method, wherein a lanthanum boride starting material containing from 1 to 50 mol % of at least one rare earth hexa-boride selected from the group consisting of $CeB_6$, $PrB_6$, $NdB_6$, $SmB_6$ and $GdB_6$, or containing from 1 to 50 mol % (calculated in terms of hexa-boride) of a mixture of boron with at least one of rare earth oxide, rare earth hydroxide and rare earth chloride at such a predetermined ratio as to provide a rare earth hexa-boride, is used.

DETAILED DESCRIPTION OF THE PREFERRED EMBODIMENT

The present invention is further described in more detail hereinafter.

The single crystal-growing method of the present invention is fusion method, and various methods are usable as mentioned above. However, among them, floating zone method (hereinafter referred to as "FZ method") is most preferable since it easily produces a large size of single crystal of high quality.

Figure 1:
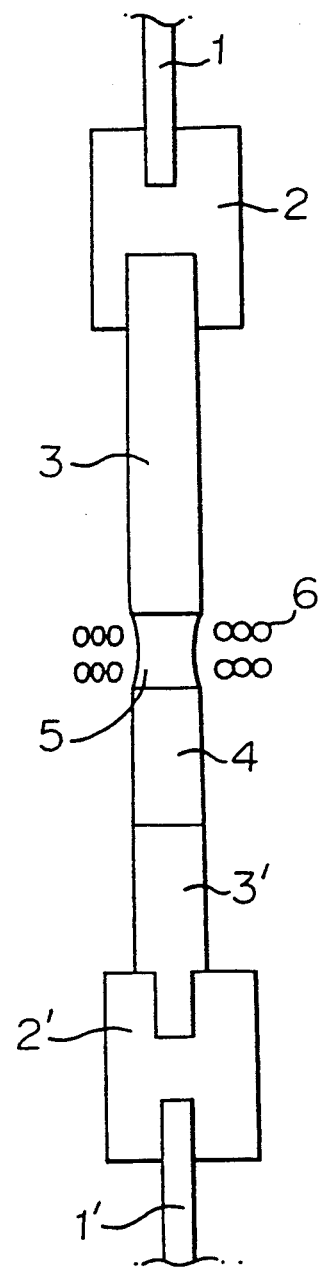
FIG. 1 illustrates an example of a furnace for crystal growth by a floating zone method (FZ).

FIG. 1 illustrates the outline of a growing furnace by FZ method, wherein 1 is an upper shaft, 1' is a lower shaft, 2, 2' are holders, 3 is a sintered rod (starting material), 3' is a seed crystal or a sintered rod for maintaining an initial molten zone, 4 is a single crystal grown, 5 is a molten zone, and 6 is a radio-frequency work coil.

The starting material is prepared by mixing from 1 to 50 mol % of cerium boride powder with lanthanum boride powder, adding a small amount of camphor as a binder to the resultant mixture, pressing the mixture thus obtained by a rubber press (2,000 kg/cm²) to form a pressed powder rod and heating the pressed powder rod in vacuum or in an inert gas atmosphere at a temperature lower than the melting point of a starting material, e.g. about from 1,500° C. to 1,800 ° C. to obtain a sintered rod of starting material.

The above mentioned sintered rod of starting material is also prepared by replacing from 1 to 50 mol % of rare earth hexa-boride powder by from 1 to 50 mol % (calculated in terms of hexa-boride) of a mixture of boron with rare earth oxide.

For example, when $CeB_6$, $PrB_6$ or $NdB_6$ is added, its oxide and boron are mixed in such a molar ratio as to proceed with the following reactions and the resultant mixture is added to powdery $LaB_6$ starting material.

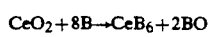

$$Pr_6O_{11} + 47B \rightarrow 6PrB_6 + 11BO$$

$$Nd_2O_3 + 15B \rightarrow 2NdB_6 + 3BO$$

In practice, a single crystal can grow even if the mixing molar ratio of boron varies within ±10% from the above mentioned molar ratio, but it is preferable to add boron in about 5% excess amount so that the molten zone can be favourably stabilized during growing.

In addition, the above mentioned sintered rod of starting material may be prepared by replacing from 1 to 50 mol % of rare earth hexa-boride powder by from 1 to 50 mol % (calculated in terms of hexa-boride) of a mixture of boron with either rare earth hydroxide or rare earth chloride in such a predetermined amount as to provide a rare earth hexa-boride.

The sintered rod of starting material 3 thus obtained is fixed to an upper shaft 1 by a holder 2, and a seed crystal or a sintered rod 3' for maintaining an initial molten zone is fixed to a lower shaft 1' by a holder 2'. The lower end of the sintered rod 3 of starting material is then fused by induction heating from the work coil 6 to form a molten zone 5, and a single crystal 4 is grown by moving the upper shaft 1 and the lower shaft 1' slowly downward.

A growing speed is from 0.2 cm to 5 cm/h, preferably from 0.2 cm to 2 cm/h. The growing is generally carried out at a melting point of a starting material or higher, preferably at a temperature of from 40° to 60° C. higher than the melting point of the starting material used. As the atmosphere, an inert gas such as argon or helium of several atms is used, and this atmosphere is effective for preventing evaporation and discharge generated in the work coil part.

The single crystal thus grown is a lanthanum boride type single crystal having the chemical formula of $(La_{1-x}M_x)B_6$ ($0.01 \leq x \leq 0.50$) wherein M at least one rare earth element selected from the group consisting of Ce, Pr, Nd, Sm and Gd. When x in the chemical formula is less than 0.01, the effect of the addition of a rare earth boride is not substantially recognized. That is, the reduction amount of grain boundary density of the single crystal is within the scope of the experimental error. On the other hand, when a rare earth boride is added in an excess amount, the resultant single crystal becomes fragile. That is, when x in the above chemical formula exceeds 0.50, the resultant single crystal sometimes produces cracks, and is not preferable for practical use.

A growing method by fusion method is not limited to the above mentioned FZ method using radio-frequency heating means, but FZ method using a lamp image furnace can also be used. Furthermore, in addition to the FZ method, various other methods such as Czochralski method, arc Verneuil's method and pedestal method may also be used, and starting materials may also be suitablly adjusted in accordance with the respective methods.

Now, the present invention will be described in more detail with reference to Example. However, it should be understood that the present invention is by no means restricted to such Example.

EXAMPLE 1

Cerium boride powder was admixed with lanthanum boride powder respectively in a predetermined amount (x=0.02, 0.05, 0.1, 0.2, 0.3, 0.4 and 0.5), and a small amount of camphor as a binder was then admixed with the resultant mixture. The mixture thus obtained was packed in a column like rubber bag having a diameter of 12 mm to prepare a column-shaped material, and the column-shaped material thus prepared was pressed by a rubber press under a pressure of 2,000kg/cm² to obtain a pressed powder rod. The pressed powder rod thus obtained was heated in vacuum at a temperature of 1,800° C. to obtain a sintered rod.

The sintered rod thus obtained was fixed to the upper shaft by the holder in the FZ growing furnace shown in FIG. 1, and a <100> seed crystal of $(La_{1-x}Ce_x)B_6$ was fixed to the lower shaft. After charging argon of 7 atms into the growing furnace, the lower end of the sintered rod of starting material was fused by the work coil to form an initial molten zone, and a single crystal was grown in the orientation of <100> by moving the upper and the lower shafts downward at a speed of 1 cm/h.

The single crystal thus obtained had a diameter of 1 cm and a length of 7 cm. As the result of analysis, the single crystal thus grown had the same composition as that of the sintered rod of starting material, and it was recognized that the composition did not change by evaporation. The concentration of cerium in the single crystal thus grown was constant in the whole part of the crystal, except for the starting part of the crystal. This was supported by the results of analysis of the molten zone solidified after growing and the ending part of the crystal, which proved that the partition coefficients of lanthanum boride and cerium boride were close to 1, and that the steady state was attained immediately after initiating the movement of the molten zone.

Figure 2:
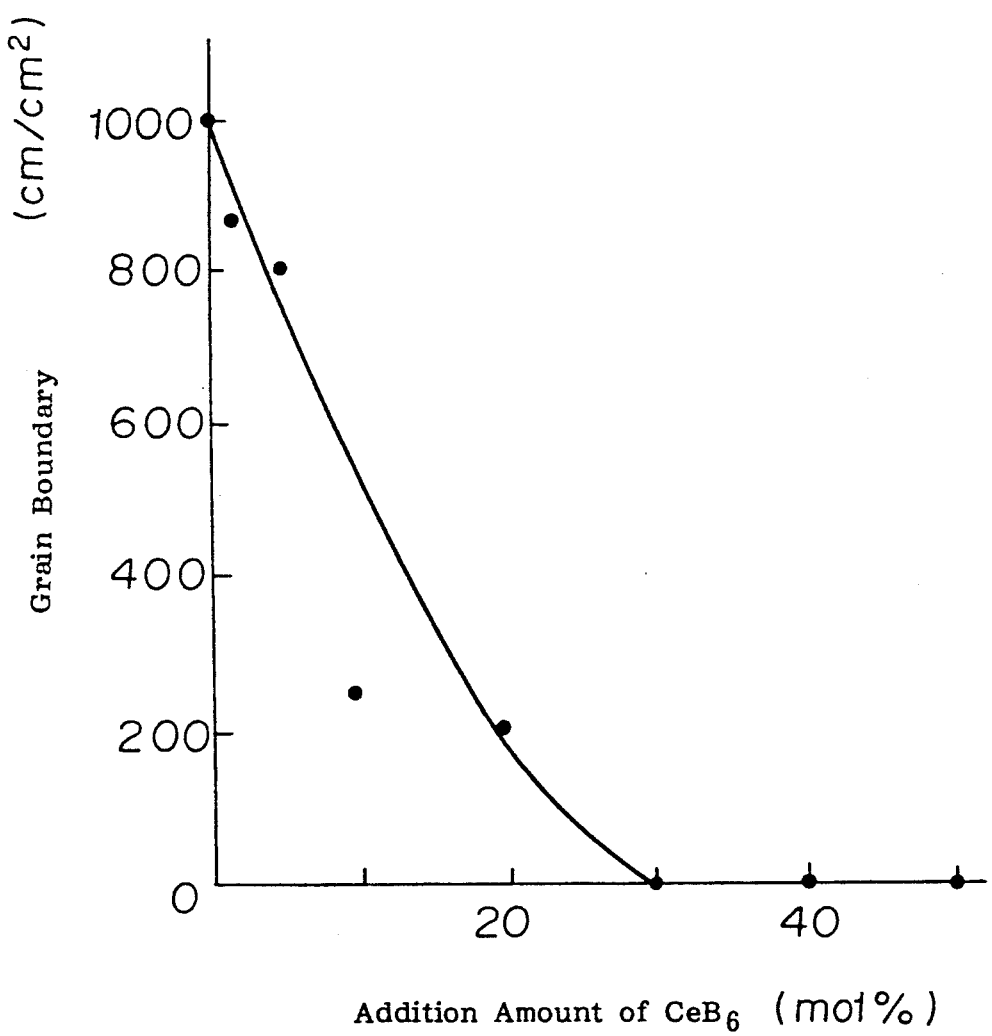
FIG. 2 illustrates the relation between grain boundary density and addition amount of cerium boride with regard to the single crystal obtained by Example 1.
Figure 3:
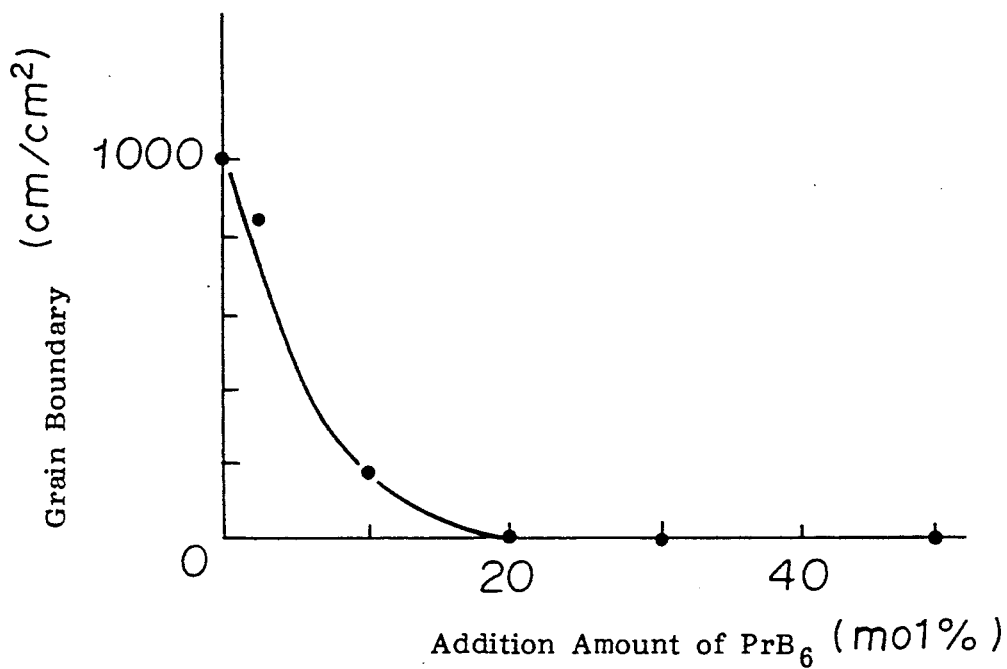
FIG. 3 illustrates the relation between grain boundary density and addition amount of praseodymium boride with regard to the single crystal obtained by Example 2.
Figure 4:
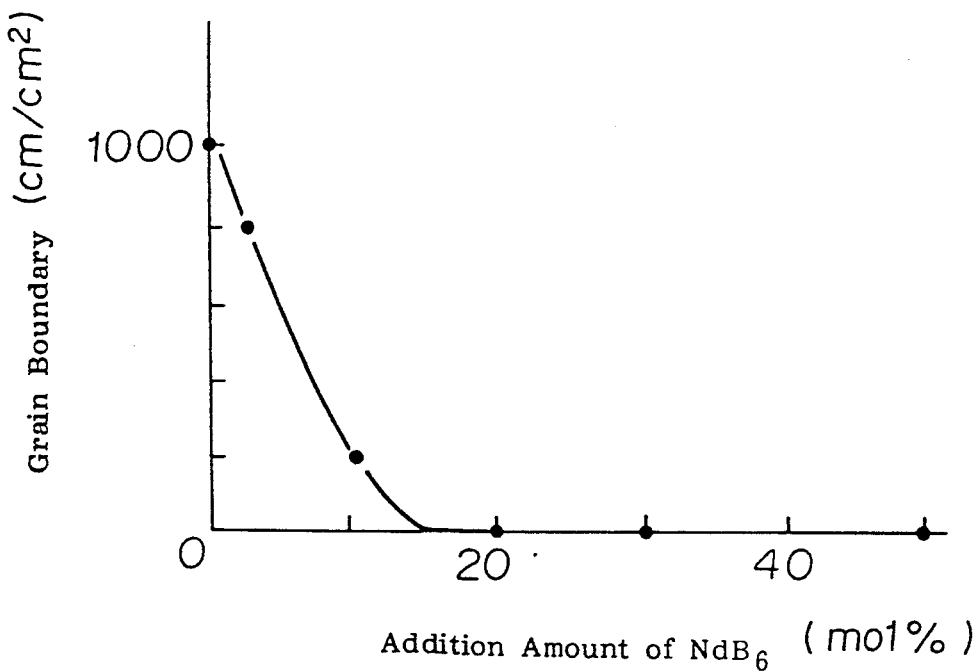
FIG. 4 illustrates the relation between grain boundary density and addition amount of neodymium boride with regard to the single crystal obtained by Example 2.
Figure 5:
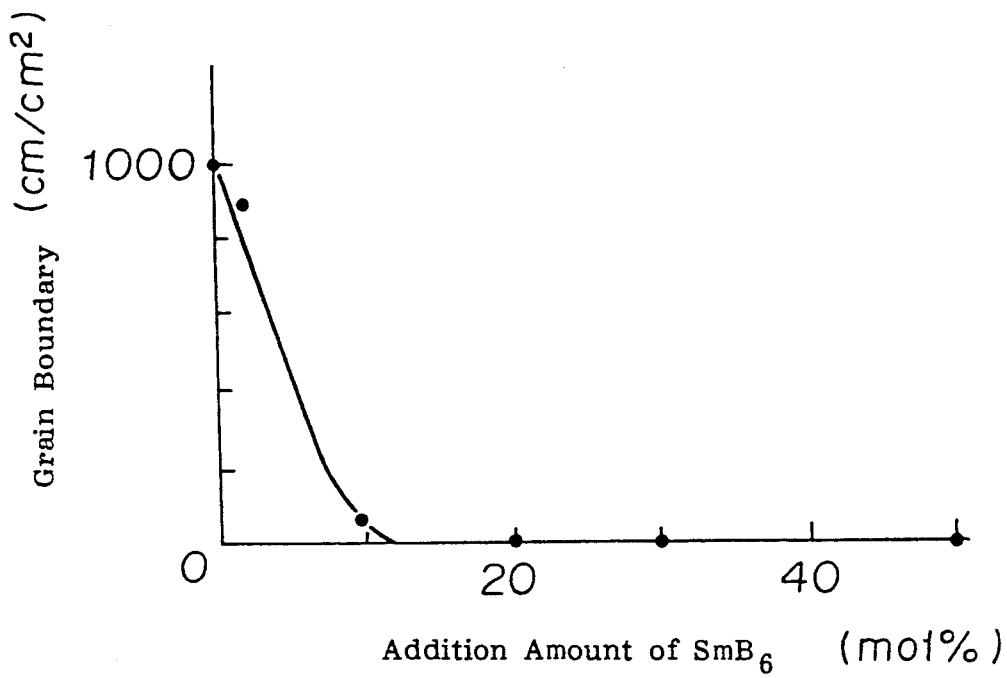
FIG. 5 illustrates the relation between grain boundary density and addition amount of samarium boride with regard to the single crystal obtained by Example 2.
Figure 6:
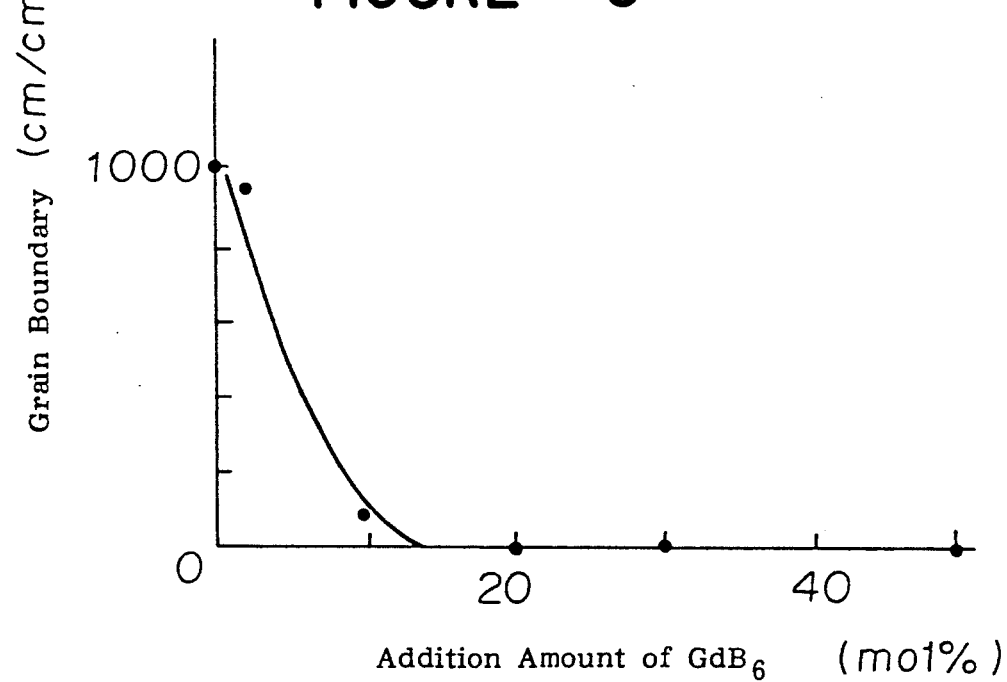
FIG. 6 illustrates the relation between grain boundary density and addition amount of gadolinium boride with regard to the single crystal obtained by Example 2.

The grain boundary density of the grown single crystal was measured by cutting (100) plane out from the ending part of the crystal, planishing the plane and etching for 2 to 3 minutes with a nitric acid solution (nitric acid: water=1:3), and the measurement results were shown in FIG. 2. As can be seen from FIG. 2, the grain boundary density was reduced according as increasing the amount of cerium boride added to lanthanum boride, and the grain boundary was not observed when cerium boride was added in an amount of 30 mol % or higher. The composition region of a single crystal wherein a grain boundary was not present, depended on the diameter of the grown crystal, and it became wider according as the diameter of the crystal became thinner. That is, when a single crystal having a diameter of 6 mm was grown from a sample containing 20 mol % of cerium boride, a grain boundary was not observed.

EXAMPLE 2

A single crystal of $(La_{1-x}M_x)B_6$ ($0.01 \leq x \leq 0.50$) was prepared in the same manner as in Example 1, except that the cerium boride powder was replaced by the other rare earth (Pr, Nd, Sm and Gd) boride powders. Each of the rare earth boride powders was mixed with lanthanum boride powder respectively in a predetermined amount (x=0.02, 0.1, 0.2, 0.3 and 0.5). The single crystal thus obtained had a diameter of 1 cm and a length of 7 cm.

The change of composition by evaporation was checked by analyzing the end part of a grown single crystal rod and a sintered rod of starting material, and it was found that the change of composition by evaporation became larger according as the atomic number of the rare earth element used was larger. For example, when 30 mol % of a rare earth boride was added, 1 mol % in the case of Pr, 2 mol % in the case of Nd, 4 mol % in the case of Sm and 5 mol % in the case of Gd were respectively lost by evaporation.

The grain boundary density of the grown single crystal was measured by cutting (100) plane out from the ending part of the crystal, planishing the plane and etching for 2 to 3 minutes with a nitric acid solution (nitric acid: water=1:3), and the measurement results were shown in FIGS. 3 to 6. As can be seen from FIGS. 3 to 6, the grain boundary density was reduced according as increasing the amount of rare earth boride added to lanthanum boride, and the grain boundary was not observed when the rare earth boride was added in an amount of 30 mol % or higher. However, according as the atomic number of the rare earth element used became larger, an etching pit was liable to be aligned in the <110> direction in a wider width. The composition region of a single crystal wherein a grain boundary was not present, depended on the diameter of the grown crystal, and it became wider according as the diameter of the crystal became thinner.

As mentioned above, the present invention provides a lanthanum boride single crystal of good quality having no defect, and the method of the present invention can be economically effected without using a lanthanum boride starting material of high purity.

What is claimed is:

1. A method for growing a single crystal having a chemical formula $(La_{1-x}M_x)B_6$, $(0.01 \leq x \leq 0.5)$ by fusion method, which comprises using a lanthanum boride starting material containing from 1 to 50 mol % of at least one rare earth hexaboride selected from the group consisting of $CeB_6$, $PrB_6$, $NdB_6$, $SmB_6$ and $GdB_6$.

2. The method according to claim 1, wherein the growing speed is from 0.2 cm to 5 cm/hr.

3. The method according to claim 1, wherein the growing is carried out in an inert atmosphere of argon or helium.

4. The method according to claim 1, wherein the rare earth boride is replaced by a mixture of boron with at least one member selected from the group consisting of rare earth oxide, rare earthhydroxide and rare earth chloride at such a predetermined ratio as to provide a rare earth hexa-boride.

5. The method according to claim 4, wherein the growing speed is from 0.2 cm to 5 cm/hr.

6. The method according to claim 4, wherein the growing is carried out in an inert atmosphere of argon or helium.

* * * * *